United States Patent
Bruchhaus et al.

(10) Patent No.: US 6,573,542 B2
(45) Date of Patent: Jun. 3, 2003

(54) CAPACITOR ELECTRODES ARRANGEMENT WITH OXYGEN IRIDIUM BETWEEN SILICON AND OXYGEN BARRIER LAYER

(75) Inventors: Rainer Bruchhaus, Higashi Gotanda (JP); Nicolas Nagel, Yokohama (JP); Hermann Wendt, Grasbrunn (DE); Igor Kasko, München (DE); Robert Primig, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/891,114

(22) Filed: Jun. 25, 2001

(65) Prior Publication Data

US 2002/0070404 A1 Jun. 13, 2002

Related U.S. Application Data

(63) Continuation of application No. PCT/DE99/04081, filed on Dec. 22, 1999.

(30) Foreign Application Priority Data

Dec. 23, 1998 (DE) ......................................... 198 60 080
Mar. 3, 1999 (DE) ......................................... 199 09 295

(51) Int. Cl.$^7$ ............................................. H01L 29/76
(52) U.S. Cl. ...................... 257/295; 257/306; 257/753; 257/763
(58) Field of Search .................. 257/295–297, 257/753, 763–765, 303, 306, 301, 309

(56) References Cited

U.S. PATENT DOCUMENTS

| | | | |
|---|---|---|---|
| 5,581,436 A | | 12/1996 | Summerfelt et al. |
| 5,796,166 A | * | 8/1998 | Agnello et al. ............. 275/751 |
| 5,852,307 A | | 12/1998 | Aoyama et al. |
| 6,015,989 A | | 1/2000 | Horikawa et al. |

FOREIGN PATENT DOCUMENTS

JP         10022469         1/1998

OTHER PUBLICATIONS

Hase et al.: "Fatigue Characteristics of PZT Capacitors with Ir/IrOx Electrodes" 1998, Picataway, NJ, USA, IEEE, USA, 24–27 pp. 7–10.

Chao et al.: "Preparation and Characterization of Iridiumoxide Thin Films Grown by DC Reactive Sputtering" Japanese Journa of Applied Physics, Tokyo, vol. 36, No. 3B, Part 1, Mar. 1, 1997, pp. 1722–1727.

(List continued on next page.)

Primary Examiner—Carl Whitehead, Jr.
Assistant Examiner—Yennhu B Huynh
(74) Attorney, Agent, or Firm—Laurence A. Greenberg; Werner H. Stemer; Ralph E. Locher

(57) ABSTRACT

The invention relates to a microelectronic structure. In the structure, an oxygen-containing iridium layer is embedded between a silicon-containing layer and an oxygen barrier layer. The iridium layer is especially produced by a sputter process in an oxygen atmosphere with a low oxygen content. The oxygen-containing iridium layer is stale at temperatures up to 800° C. and withstands the formation of iridium silicide upon contact with the silicon-containing layer. Such micro-electronic structures are preferably used in semiconductor memories.

16 Claims, 7 Drawing Sheets

OTHER PUBLICATIONS

Onishi et al.: "A New High Temperature Electrode–Barrier Technology on High Density Ferroelectric Capacitor Structure" 1996 IEEE—IEDM 96 pp. 699–702.

Kudo et al.: "A High Stability Electrode Technology for Stacked SrBi2Ta2O9 Capacitors Applicable to Advanced Ferroelectric Memory", 1997 IEEE—IEDM 97 pp. 609–612.

Aoyama et al.: "Interfacial Layers between Si and Ru Films Deposited by Sputtering in Ar/O2 Mixture Ambient" Journal of Applied Physics vol. 37 (1998), pp. L242–244.

Saenger et al.: "Buried, self–aligned barrier layer structures for perovskite–based memory devices comprising Pt or Ir bottom electrodes on silicon–contributing substrates", Journal of Applied Physics vol. 83 (1998) pp. 802–813.

Jeon et al.: "Thermal Stability of Ir/polycrystalline–Si structure for bottom electrode of integrated ferroelectric capacitors", Appl. Phys. Lett. 71, Jul. 28, 1997, pp. 467–469.

Onishi et al.: "High Temperature Barrier Electrode Technology for High Density Ferroelectric Memories with Stacked Capacitor Structure", J. Electrochem. Soc., vol. 145, No. 7, Jul. 1998, pp. 2563–2568.

Bhatt et al.: "Novel high temperature multiplayer electrode–barrier structure for high–density ferroelectric memories", Appl. Phys. Lett. 71 (5) Aug. 4, 1997, pp. 719–721.

* cited by examiner

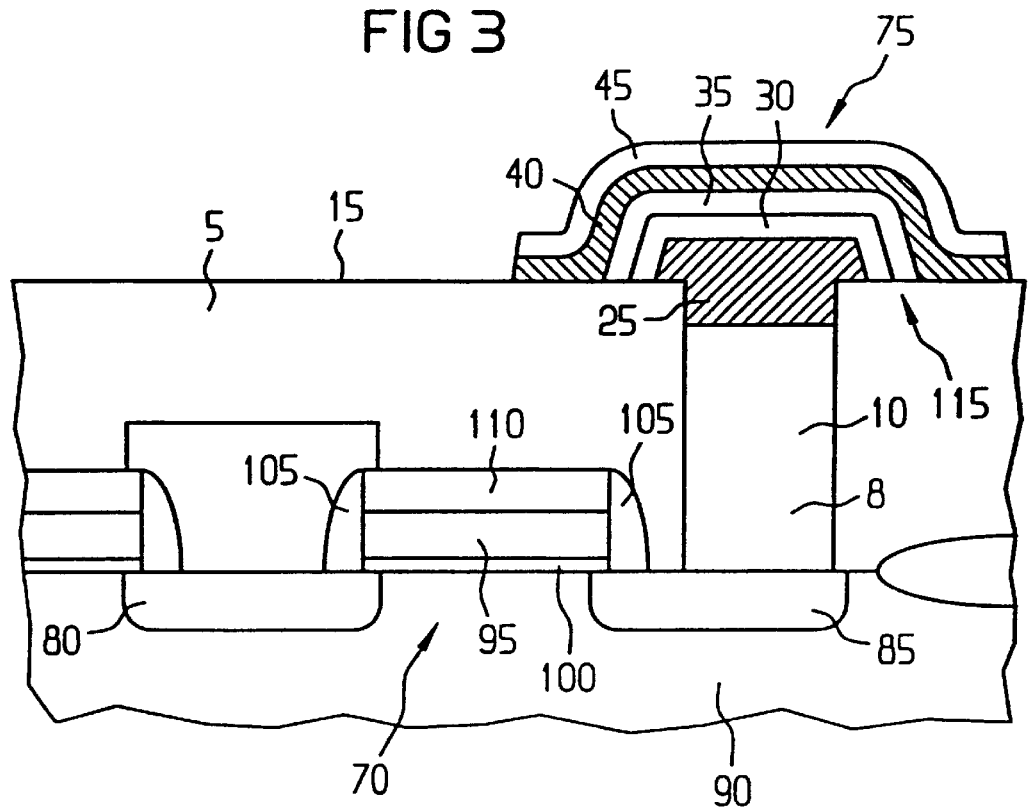

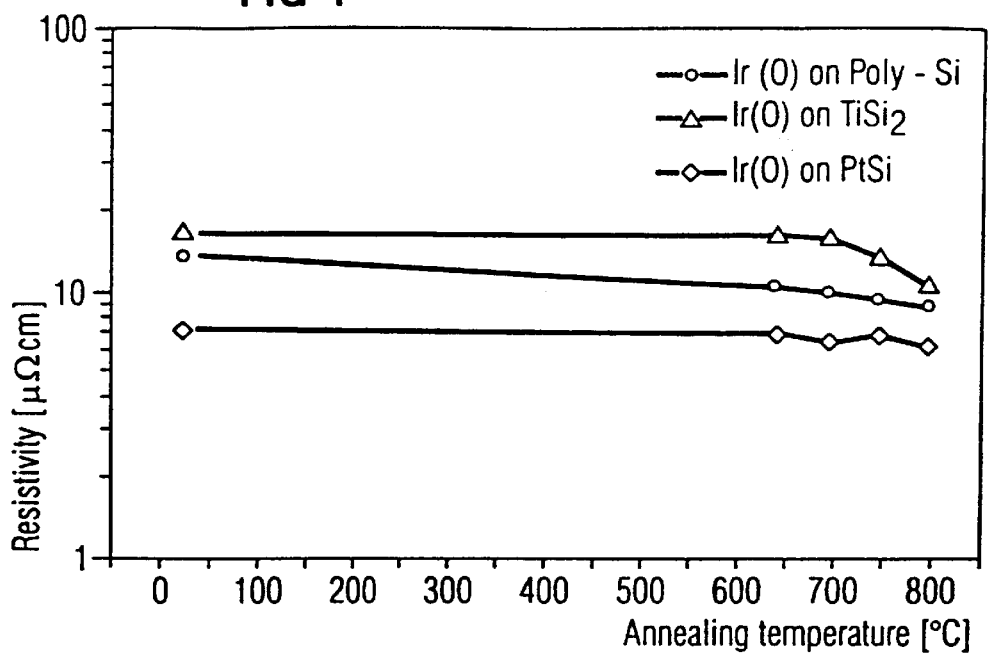
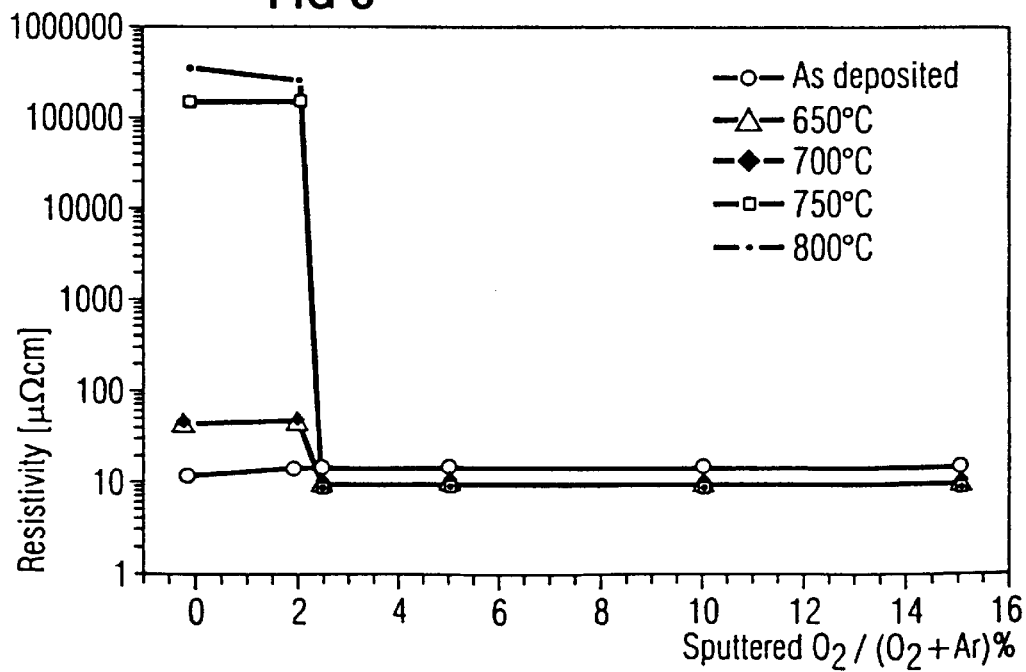

CAPACITOR ELECTRODES ARRANGEMENT WITH OXYGEN IRIDIUM BETWEEN SILICON AND OXYGEN BARRIER LAYER

CROSS-REFERENCE TO RELATED APPLICATION

This application is a continuation of copending International Application No. PCT/DE99/04081, filed Dec. 22, 1999, which designated the United States.

BACKGROUND OF THE INVENTION

FIELD OF THE INVENTION

The invention relates to the area of semiconductor technology and concerns a microelectronic structure with a base substrate, a silicon-containing layer and an oxygen-barrier layer.

In order to achieve a further increase in the storage capacity of semiconductor memories, efforts are being made to use high-∈ dielectrics (∈>20) or ferroelectric dielectrics. During their deposition and conditioning, the preferred high-∈ and ferroelectric dielectric materials require temperatures of up to 800° C. and atmospheres containing oxygen. Under such conditions, however, prior art materials used for electrodes can be expected to undergo rapid oxidation. Therefore, the use of oxidation resistant electrode materials was also suggested. Platinum, for example, is a prominent example. When using platinum, however, the problem arises that direct contact of platinum with silicon at the high process temperatures leads to the interfering formation of platinum silicide. In addition, oxygen can diffuse through platinum relatively easily and oxidize the silicon located beneath it. For these reasons a barrier is necessary between the platinum electrode and a contact hole filled with polysilicon that connects the electrode with a selection transistor.

The barriers must meet, in particular, the following requirements. On the one hand they must prevent silicon from diffusing from the contact hole to the platinum electrode and, on the other, they must inhibit diffusion of oxygen from the platinum to the contact hole in order to exclude the electrically insulating oxidation of silicon. Moreover, the barriers themselves must be stable under the process conditions.

A possible design for a microelectronic structure as mentioned at the beginning—in the form of an electrode barrier system—is described, for example, in U.S. Pat. No. 5,581,439. There, a titanium nitride layer preventing the diffusion of silicon is buried in a silicon nitride layer, which protects the titanium nitride layer from oxidation, at least laterally. The silicon nitride collar supports a palladium base body with a platinum coating, which together form the electrodes. At the same time the titanium nitride layer should be protected from oxidation at least through the palladium.

In contrast, the design of a further electrode barrier system with other materials is described in the publication by J. Kudo et al., "A High Stability Electrode Technology for Stacked $SrBi_2Ta_2O_9$ Capacitors Applicable to Advanced Ferroelectric Memory", IEDM 1997, pp. 609 to 612. In the design published there, a barrier of tantalum silicon nitride covered by a layer of pure iridium and a layer of iridium dioxide is preferred. The tantalum silicon nitride barrier prevents the diffusion of silicon but must itself be protected from oxidation. This task is performed by the iridium oxide layer and the pure iridium layer. It has been found, however, that at high temperatures, especially at 800° C., the pure iridium layer and the tantalum silicon nitride barrier together form iridium silicide, which has poor electrical conductivity.

The same problems also occur with the design favored by Saenger et al., "Buried, self-aligned barrier layer structures for perovskite-based memory devices including Pt or Ir bottom electrodes on silicon-contributing substrates", J. Appl. Phys. 83(2), 1998, pp. 802–813. This publication reports that an interfering iridium silicide is formed from pure iridium and polysilicon during a recovery step in an atmosphere of nitrogen. This siliconization should therefore be prevented by a preceding recovery step in an atmosphere containing oxygen through complete oxidation of the iridium. Unfortunately this recovery step can be controlled only with difficulty, especially in respect of in-depth oxidation of the iridium, so that if the iridium layer is of uneven thickness oxidation of the polysilicon can also occur, resulting in an interruption of the electrical contact between the polysilicon and the iridium.

The use of a deposited pure iridium layer with subsequent oxygen treatment is also reported in the publication by Jeon et al., "Thermal stability of Ir/polycrystalline-Si structures for bottom electrode of integrated ferroelectric capacitors", Appl. Phys. Lett. 71(4), 1997, pp. 467–469. On the other hand, the use of iridium dioxide as barrier is described in Cho et al., "Preparation and Characterization of Iridium Oxide Thin Films Grown by DC Reactive Sputtering", Jpn. J. Appl. Phys. 36, 1997, pp. 1722–1727. Furthermore, the use of a multi-layer system of platinum, ruthenium and rhenium is known from Onishi et al., "A New High Temperature Electrode-Barrier Technology On High Density Ferroelectric Capacitor Structure", IEDM 96, pp. 699–702; Bhatt et al., "Novel high temperature multilayer electrode-barrier structure for high-density ferroelectric memories", Appl. Phys. Lett. 71(5), 1997, pp. 719–721; Onishi et al., "High Temperature Barrier Electrode Technology for High Density Ferroelectric Memories with Stacked Capacitor Structure", Electrochem. Soc. 145, 1998, pp. 2563–2568; Aoyama et al., "Interfacial layers between Si and Ru Films Deposited by Sputtering in Ar/O2 Mixture Ambient", Jpn. J. Appl. Phys. 37, 1998, pp. L242–L244.

A further barrier approach is proposed in U.S. Pat. No. 5,852,307, which describes the use of a slightly oxidized ruthenium layer and a ruthenium dioxide layer.

However, all of the barrier layers of prior art are accompanied by the risk that they are no longer sufficiently stable at the high process temperatures required, especially during a necessary temperature step for conditioning the high-∈ materials and/or the ferroelectric materials.

SUMMARY OF THE INVENTION

It is accordingly an object of the invention to provide a microelectronic structure and a method for fabricating the structure which overcomes the above-mentioned disadvantageous of the prior art apparatus and methods of this general type, and in particular, to provide a microelectronic structure which is sufficiently stable at temperatures up to 800° C.

With the foregoing and other objects in view there is provided, in accordance with the invention a microelectronic structure, that includes: a base substrate; a silicon-containing layer; an oxygen-barrier layer; and an oxygen-containing iridium layer located between the silicon-containing layer and the oxygen-barrier layer. The oxygen-containing iridium layer is a sputtered layer that is fabricated by sputtering in an atmosphere containing oxygen at a temperature of at least 250° C. with a volume percent of oxygen in the atmosphere being between 2.5% and 15%.

The oxygen-containing iridium layer in the microelectronic structure prevents diffusion of silicon out of the silicon-containing layer and into the oxygen-barrier layer and any further layers arranged beyond it. To this end the oxygen-containing iridium layer contains a specific proportion of oxygen, which prevents the formation of iridium silicide and thereby the further diffusion of silicon. In addition, the boundary layer between the oxygen-containing iridium layer and the silicon-containing layer also remains essentially free of iridium silicide at temperatures up to at least 800° C. This can be proved, for example through resistance measurements of the oxygen-containing iridium layer. The absence of iridium silicide is indicated, for example, by a very low resistivity of the oxygen-containing iridium layer of less than 100 $\mu$ohm * cm, preferably even less than 30 $\mu$ohm * cm. In the presence of iridium silicide, which has a very high resistivity of approx. 6 ohm * cm, the resistivity of the structure formed from the silicon-containing layer and the oxygen-containing iridium layer would be considerably greater than 100 $\mu$ohm * cm. The low electrical resistance of the microelectronic structure is of considerable advantage, especially in maximally integrated semiconductor components—especially in semiconductor memories with structural sizes of 0.25 $\mu$m and below.

In addition, as a result of the oxygen-containing iridium layer, contact between the silicon-containing layer and the oxygen-barrier layer is avoided as far as possible in order to prevent a possible reduction of the oxygen-barrier layer by the silicon-containing layer and the associated oxidation of the silicon-containing layer.

An oxygen-containing iridium layer with the above characteristics can be fabricated, for example, by means of a sputtering method in an oxygen-containing atmosphere with a low oxygen concentration, whereby the volume percent of oxygen in the atmosphere lies between 2.5% and 15%. Through the limited volume percent of oxygen in the atmosphere, oxygen is also incorporated into the iridium layer to only a specific extent so that it is also possible to speak of an anoxidized iridium layer. The volume percent of oxygen in the atmosphere is preferably approximately 5%.

Experiments have shown that oxygen-containing iridium layers fabricated at a volume percent of approximately 2.5% oxygen still resist siliconization to the maximum possible extent, whereas oxygen-containing iridium layers fabricated in an atmosphere containing less than 2.5% oxygen already have a considerable tendency towards siliconization. On the other hand, an oxygen-containing iridium layer deposited at an oxygen volume concentration of maximally 15% does not yet lead to an interfering oxidation of the silicon-containing layer beneath the oxygen-containing iridium layer.

In accordance with an added feature of the invention, the oxygen-containing iridium layer is deposited at a temperature of at least 250° C. in order to improve the adhesion of the oxygen-containing iridium layer. This results, in particular, in an improved adhesion between the oxygen-containing iridium layer and the silicon-containing insulating layers which, for example, consist of silicon nitride and silicon oxide. Since the base substrate itself can consist of silicon oxide or silicon nitride, the deposition of the oxygen-containing iridium layer at increased temperatures also achieves a good adhesion of the oxygen-containing iridium layer to the base substrate. The deposition temperature should principally be chosen high enough to ensure adequate adhesion to the base substrate, whereby this enables an adhesive strength of at least 100 kg/cm$^2$ to be achieved.

A further advantage of depositing the oxygen-containing iridium layer at a temperature of at least 250° C. consists therein that a further conditioning step to improve the adhesion of the oxygen-containing iridium layer is not necessary. As long as the deposition temperature chosen is not too high, for example between 250° C. and 400° C., already created structures are subjected to hardly any thermal stress.

In accordance with an additional feature of the invention, the oxygen barrier consists of a conductive metal oxide. Iridium dioxide and ruthenium dioxide have especially proved themselves to be a suitable metal oxide. The use of these metal oxides also ensures good adhesion of the oxygen-barrier layer to the oxygen-containing iridium layer.

In accordance with another feature of the invention, the silicon-containing layer, which is located as a rule beneath the oxygen-containing iridium layer, preferably consists of polysilicon, of a metal silicide, or of a stack of layers which includes at least one polysilicon layer and one metal silicide layer located between the polysilicon layer and the oxygen-containing iridium layer. Preferably the metal silicide consist of at least one silicide from the group yttrium silicide, titanium silicide, zirconium silicide, hafnium silicide, vanadium silicide, niobium silicide, tantalum silicide, chromium silicide, molybdenum silicide, tungsten silicide, iron silicide, cobalt silicide, nickel silicide, palladium silicide, platinum silicide, and copper silicide. The metal and the silicon can be present in different stoichiometric relationships. The metal silicides used can also be of tertiary structure and comply with the general formula MSiN where M stands for a metal and N stands for nitrogen.

In accordance with a further feature of the invention, it has been found to be advantageous to bury at least the silicon-containing layer in the base substrate and to cover it completely with the oxygen-containing iridium layer. In this way the silicon-containing layer is protected by the base substrate from attack by oxygen, at least laterally, and the silicon located in the silicon-containing layer is prevented from diffusing through the oxygen-containing iridium layer. In this construction the silicon-containing layer can, for example, be present in the form of a contact hole filled with polysilicon, that can optionally be bounded by a metal silicide layer in the direction of the oxygen-containing iridium layer.

It is also advantageous, however, to bury the silicon-containing layer and the oxygen-containing iridium layer together in the base substrate and to cover them completely with the oxygen-barrier layer. In this structure, any problems with adhesion of the oxygen-containing iridium layer to the base substrate are avoided in that the oxygen-containing iridium layer is in contact with the base substrate only on its lateral bounding surface (border). In contrast, the adhesion of the oxygen-containing iridium layer to a conductive silicon-containing layer, especially to polysilicon or a metal silicide, is generally sufficiently strong.

In accordance with a further added feature of the invention, the oxygen-containing iridium layer preferably has a thickness of approximately 100 nm, advantageously even of approximately 20 to 50 nm. Efforts are made to form the oxygen-containing iridium layer as space-saving and as thin as possible. The barrier layers contained in the microelectronic structure (oxygen-barrier layer, oxygen-containing iridium layer) are advantageously covered by a metal-containing electrode layer. The oxygen-barrier layer in particular should be coated as completely as possible by this layer. The metal-containing electrode layer preferably consist of a metal (e.g. platinum, ruthenium, iridium, palladium, rhodium, rhenium, osmium) or a conductive metal oxide ($MO_x$, e.g. ruthenium oxide, osmium oxide, rhodium oxide, iridium oxide, rhenium oxide or conductive perovskites, e.g. $SrRuO_3$ or $(La,Sr)CoO_3$). Platinum is especially preferred as the metal. On the metal-containing electrode layer there is a dielectric metal-oxide-containing layer which, especially in the case of a semiconductor memory, constitutes the high-∈ dielectric or the ferroelectric capacitor dielectric. For the dielectric metal-oxide-containing layer, metal oxides are especially used of the general formula $ABO_x$ or $DO_x$, where A stands especially for at least one metal from the group strontium (Sr), bismuth (Bi), niobium (Nb), lead (Pb), zirconium (Zr), lanthanum (La), lithium (Li), potassium (K), calcium (Ca) and barium (Ba), B stands especially for at least one metal from the group titanium (Ti), niobium (Nb), ruthenium (Ru), magnesium (Mg), manganese (Mn), zirconium (Zr) or tantalum (Ta), D stands for titanium (Ti) or tantalum (Ta) and O stands for oxygen. X can be between 2 and 12. Depending on their composition, these metal oxides can have dielectric or ferroelectric properties, whereby these properties may not be detectable until after a high-temperature step for crystallization of the metal oxides. Under certain circumstances these materials exist in a polycrystalline form, whereby perovskite-like crystal structures, mixed crystals or superlattices can frequently be observed. In principal, all perovskite-like metal oxides of the general form $ABO_x$ are suitable for forming the dielectric metal-oxide-containing layer. Dielectric materials with high ∈ (∈>20) and materials with ferroelectric properties are, for example, barium strontium titanate (BST, $Ba_{1-x}Sr_xTiO_3$), niobium-doped strontium bismuth tantalate (SBTN, $Sr_xBi_y(Ta_zNb_{1-z})O_3$), strontium titanate (STO, $SrTiO_3$), strontium bismuth tantalate (SBT, $Sr_xBi_yTa_2O_9$), bismuth titanate (BTO, $Bi_4Ti_3O_{12}$), lead zirconate titanate (PZT, $Pb(Zr_xTi_{1-x})O_3$), strontium niobate (SNO, $Sr_2Nb_2O_7$), potassium titanate niobate (KTN) and lead lanthanum titanate (PLTO, $(Pb,La)TiO_3$). In addition, tantalum oxide ($Ta_2O_5$) is also used as high-∈ dielectric. In the following, the term "dielectric" is used to mean a dielectric, paraelectric or ferroelectric layer, so that the dielectric metal-oxide-containing layer can exhibit dielectric, paraelectric or ferroelectric properties.

With the foregoing and other objects in view there is provided, in accordance with the invention, a method of using the microelectronic structure in a semiconductor memory device. The microelectronic structure is preferably used in a semiconductor memory device which has at least a first and a second electrode and between them a metal-oxide-containing layer, which together form a storage capacitor. The first electrode of this semiconductor memory device thereby includes at least the oxygen-containing iridium layer and the oxygen-barrier layer so that in addition to an optional noble metal layer, the first electrode also contains the necessary diffusion barriers.

In a preferred microelectronic structure, the base substrate consists in particular of silicon oxide, silicon nitride or of a layer combination of these materials. The base substrate is interspersed by at least one contact hole filled with polysilicon or a different conductive material. Possibly the filled contact hole is closed off level with the surface of the base substrate with a metal silicide layer arranged in the contact hole. Finally, the oxygen-containing iridium layer sits on the surface of the base substrate, covers the contact hole completely, extends laterally beyond it and is in direct contact with the base substrate where it does so.

With the foregoing and other objects in view there is provided, in accordance with the invention, a method for fabricating a microelectronic structure, that includes:

providing a microelectronic structure having a base substrate;

and depositing an oxygen-containing iridium layer on the base substrate by sputtering in an atmosphere containing oxygen at a temperature of at least 250° C., whereby a volume percent of oxygen in the atmosphere is between 2.5% and 15%.

Other features which are considered as characteristic for the invention are set forth in the appended claims.

Although the invention is illustrated and described herein as embodied in a capacitor electrodes arrangement, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 shows a microelectronic structure as part of a semiconductor memory device;

FIG. 4 shows the resistivity of an oxygen-containing iridium layer in dependence on the temperature stress;

FIG. 5 shows the resistivity of an oxygen-containing iridium layer in dependence on the oxygen concentration in the atmosphere during deposition;

DESCRIPTION OF THE PREFERRED EMBODIMENTS

Figure 1A:
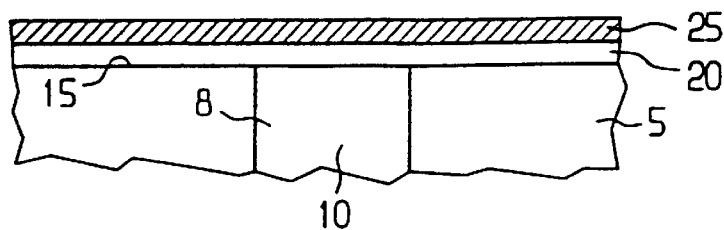
FIGS. 1a to 1e show individual process steps for the fabrication of a microelectronic structure.

Referring now to the figures of the drawing in detail and first, particularly, to FIGS. 1a–1e thereof, there is shown process steps for fabricating a microelectronic structure. Fabrication of the microelectronic structure begins with a base substrate 5 of silicon dioxide (fabricated, for example, through deposition using tetra-ethyl orthosilane (TEOS)) or silicon nitride, that is interspersed with a contact hole 10 filled with polysilicon 8. The filled contact hole 10 ends evenly with the surface 15 of the base substrate 5. This is achieved, for example, through a suitable polishing step, for example through chemical mechanical polishing (CMP). After an approximately one-minute cleaning of the polysilicon with 0.3% hydrofluoric acid (HF), through which the natural oxide of the polysilicon layer 8 is removed, a tungsten silicide layer 20 with a thickness between 30 and 100 nm is then deposited on the surface 15 of the base substrate 5. Optionally, a titanium layer of the same thickness can be applied instead of the tungsten silicide whereby, however, the titanium is as far as possible completely siliconized by the polysilicon 8 in the contact hole 10 during a later high-temperature step. The tungsten silicide layer 20 constitutes here the silicon-containing layer. It is also possible to apply a polysilicon layer instead of the tungsten silicide layer 20 so that an adhesive layer (polysilicon, silicide) is located between the base substrate and the oxygen-containing iridium layer to be applied subsequently.

Then, an oxygen-containing iridium layer 25 is applied to the tungsten silicide layer 20 through the reactive sputtering of iridium. This takes place at a pressure between 0.005 and 0.02 mbar, preferably at 0.015 mbar, and in an oxygen/argon mixture with the volume percent of oxygen between 2.5% and 15%, preferably at 5% ($2.5\% \leq O_2/(O_2+Ar) \leq 15\%$). After a sputtering process lasting approximately 100 sec an approximately 50 to 150 nm thick oxygen-containing iridium layer 25 has formed which completely covers the tungsten silicide layer 20. The deposited oxygen-containing iridium layer 25 resists the formation of iridium silicide on contact with the tungsten silicide even at very high temperatures which, for example, can reach up to 800° C. during a so-called Ferroaneal performed later. This power of resistance is also observed in the case of an oxygen-containing iridium layer 25 deposited directly on the polysilicon.

Figure 1B:
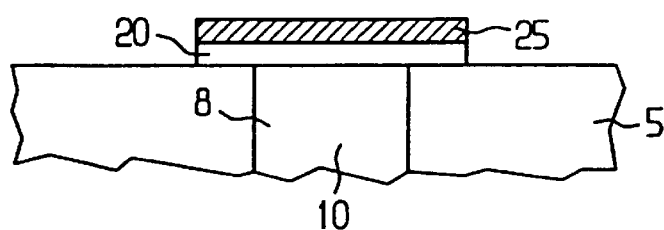

Preferably the oxygen-containing iridium layer 25 and the tungsten silicide layer 20 are etched anisotropically together, whereby after etching the two layers should still project slightly in a lateral direction over the contact hole 10 in order to completely cover the polysilicon within it. The Ad structure obtained in this way is shown in FIG. 1b.

Figure 1C:
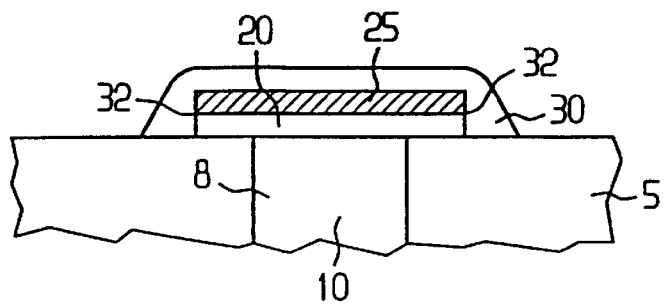

In a further process step according to FIG. 1c an approximately 100 nm thick oxygen-barrier layer 30 of iridium dioxide is applied to the oxygen-containing iridium layer 25 and the base substrate 5 and anisotropically etched using a mask. In this step care must be taken that the iridium dioxide layer 30 completely covers the oxygen-containing iridium layer 25 and the tungsten silicide layer 20, also at their lateral regions 32. In this way complete protection of the oxygen-containing iridium layer 25 and the tungsten silicide layer 20 is guaranteed against attack by oxygen, and contact is prevented between the oxygen-containing iridium layer 25 and a noble metal layer 35 of platinum to be applied subsequently. The separation of the oxygen-containing iridium layer 25 from the platinum layer 35 is intended in particular to prevent the formation of a platinum/iridium alloy, which could possibly lead to unfavorable boundary area properties of the platinum layer 35.

Figure 1D:
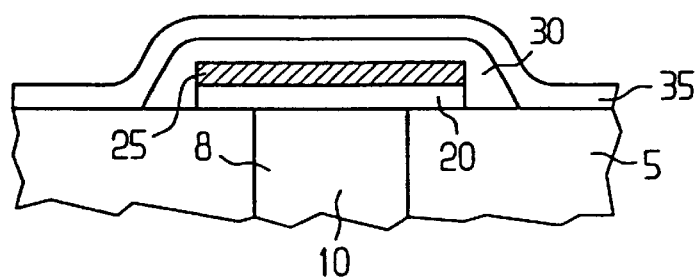
Figure 1E:
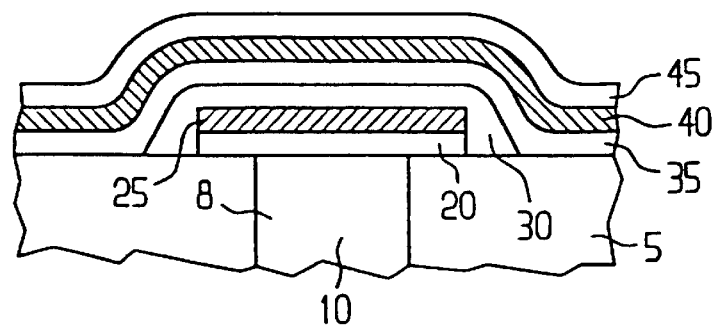

The noble metal layer 35 illustrated in FIG. 1d, which can also optionally consist of ruthenium, is subjected to deposition of a strontium bismuth tantalate layer (SBT) 40 by means of an organometallic CVD method or an MOD method (e.g. spin-on method) using beta-diketonates. This is preferably performed at temperatures between 300 and 800° C. and, especially in the case of MOCVD methods, in an oxygen-containing atmosphere in order to oxidize the strontium and bismuth beta-diketonates. Finally, a further noble metal layer 45 of platinum is applied to the entire surface. In this exemplary embodiment the SBT layer 40 forms the dielectric metal-oxide-containing layer.

Process steps for the fabrication of a microelectronic structure with a buried oxygen-containing iridium layer are illustrated in the FIGS. 2a to 2f. Here too, the method starts from a base substrate 5, which can optionally be constructed from two layers. In this case the base substrate 5 consists of a lower silicon dioxide layer 50 with a silicon nitride or TEOS layer 55 positioned above it. The base substrate 5 also has a contact hole 10 which, however, is not filled with polysilicon as far as the surface 15 of the base substrate 5.

Fabrication of this structure is achieved in particular through a reverse etching step after filling the contact hole. After cleaning this structure (illustrated in FIG. 2a) with hydrofluoric acid, a platinum, titanium or cobalt layer with a thickness between 30 and 100 nm is then applied to it and subjected to silicide formation. A metal silicide is thereby formed exclusively in the region of the contact hole 10 filled with polysilicon. As a result of the different etching characteristics of the metal silicide formed compared with the non-siliconized metal, the titanium, platinum or cobalt layer is removed again except for the self-aligned metal silicide 65 which was produced. However, the metal silicide 65 formed from titanium, platinum or cobalt does not reach as far as the surface 15 of the base substrate 5 so that the contact hole 10 is not yet completely filled.

Figure 2A:
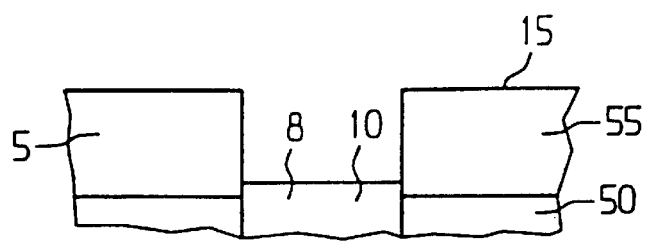
FIGS. 2a to 2f show further process steps for the fabrication of a microelectronic structure.
Figure 2B:
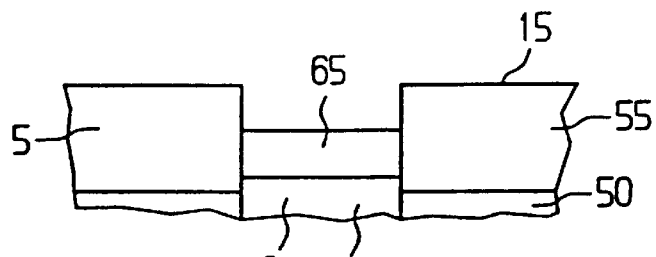
Figure 2C:
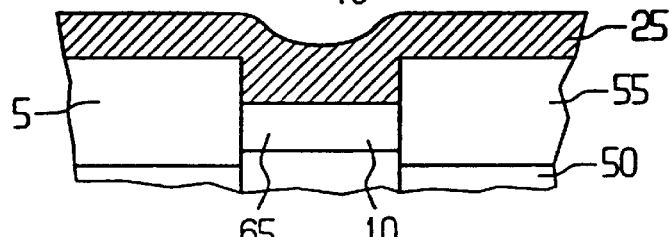
Figure 2D:
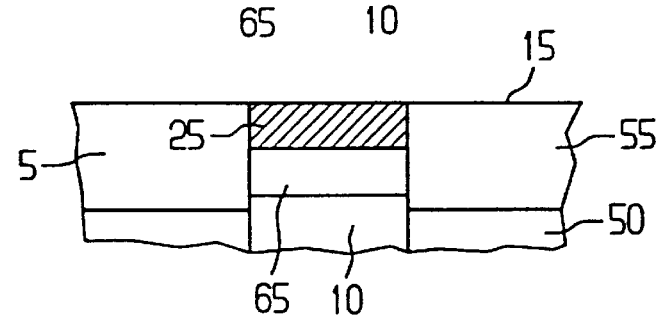
Figure 2E:
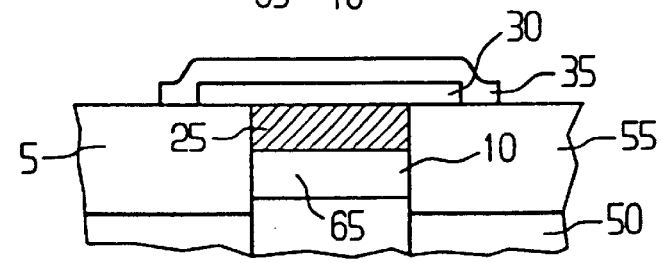
Figure 2F:
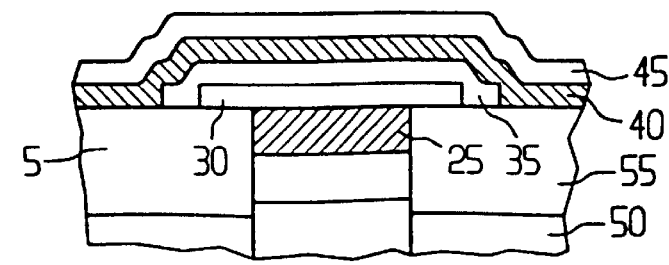

Now an oxygen-containing iridium layer 25 in a material thickness of between 50 and 150 nm is applied to the base layer 5. The oxygen-containing iridium layer 25 is then ground back as far as the TEOS layer 55. The structure obtained, in which the oxygen-containing iridium layer 25 ends level with the surface 15 of the base substrate 5, is illustrated in FIG. 2d.

It is also possible to leave the oxygen-containing iridium layer 25 at least partly on the surface 15 of the base substrate 5. In this case, in order to avoid any problems occurring with the adhesion between the oxygen-containing iridium layer 25 and the base substrate 5 it is recommended that the base substrate 5 be heated to at least 250° C. during the deposition of the oxygen-containing iridium layer 25. For example, a temperature of approximately 300° C. is favorable. Moreover, an increased temperature also improves the adhesion of the oxygen-containing iridium layer to the metal silicide.

Subsequently the oxygen-barrier layer 30 of iridium dioxide is applied and structured, whereby the contact hole 10 is completely covered by this layer. Then the noble metal layer 35, the dielectric metal-oxide-containing layer 40 and the further noble metal layer 45 are applied and appropriately structured.

There follows a high-temperature recovery step (e.g. Ferroaneal) in an oxygen-containing atmosphere for crystallizing out the dielectric metal-oxide-containing layer 40. Especially when using SBT as the dielectric metal-oxide-containing layer 40, this treatment must be carried out at 800° C. for approximately 1 hour. During this treatment the SBT should crystallize out completely in order thereby to achieve as high as possible remanent polarization of the SBT layer 40. The high-temperature step can also optionally be performed before the deposition of the further noble metal layer 45.

A semiconductor memory device containing the microelectronic structure according to the invention is illustrated in FIG. 3. This device includes a selection transistor 70 and a storage capacitor 75. The selection transistor 70 has two mutually separated doped regions 80 and 85 in a single crystal silicon substrate 90, which constitute a source and a drain region (80, 85) of the selection transistor 70. The gate electrode 95 with gate dielectric 100 laid beneath it is arranged on the silicon substrate 90 between the two doped regions 80 and 85. The gate electrode 95 and the gate dielectric 100 are surrounded by lateral insulating ridges 105 and by upper insulating layers 110. The entire structure is completely covered by the base substrate 5. A contact hole 10 extends through the base substrate 5 as far as the doped region 85, through which the storage capacitor 75 seated on the base substrate 5 is connected with the selection transistor 70.

The storage capacitor 75 for its part consists of a bottom electrode 115, a capacitor dielectric 40 and a top electrode 45. In this exemplary embodiment the bottom electrode includes a platinum layer 35, an iridium oxide layer 30 and an oxygen-containing iridium layer 25. Thus the bottom electrode 115 is of multilayer construction and also includes all the barrier layers necessary to protect the polysilicon 8 in the contact hole 10 from oxidation and for protection against an unwanted diffusion of silicon.

The oxygen-containing iridium layer 25 can be characterized through a very low resistivity. This is illustrated for example in FIG. 4, which shows curves measured of anoxidized iridium (oxygen-containing iridium layer designated Ir(O)) on different silicon-containing layers. For this purpose anoxidized iridium was deposited on polysilicon, titanium silicide and platinum silicide in an atmosphere containing 5% oxygen and subsequently treated at different temperatures for approximately 1½ hours. In the temperature range between room temperature and 800° C. the resistivity is always less than 20 $\mu$ohm * cm; in the case of anoxidized iridium on platinum silicide it is even considerably lower than 10 $\mu$ohm * cm.

The dependence of the resistivity on the oxygen content of the atmosphere during deposition of the anoxidized iridium is illustrated in FIG. 5. A steep fall in resistivity between 2 and 2½% volume percent of oxygen is clearly evident. It is also evident that subsequent thermal treatment at relatively high temperatures between 650 and 800° C. can even be expected to cause a further decrease in resistivity.

Figure 8:
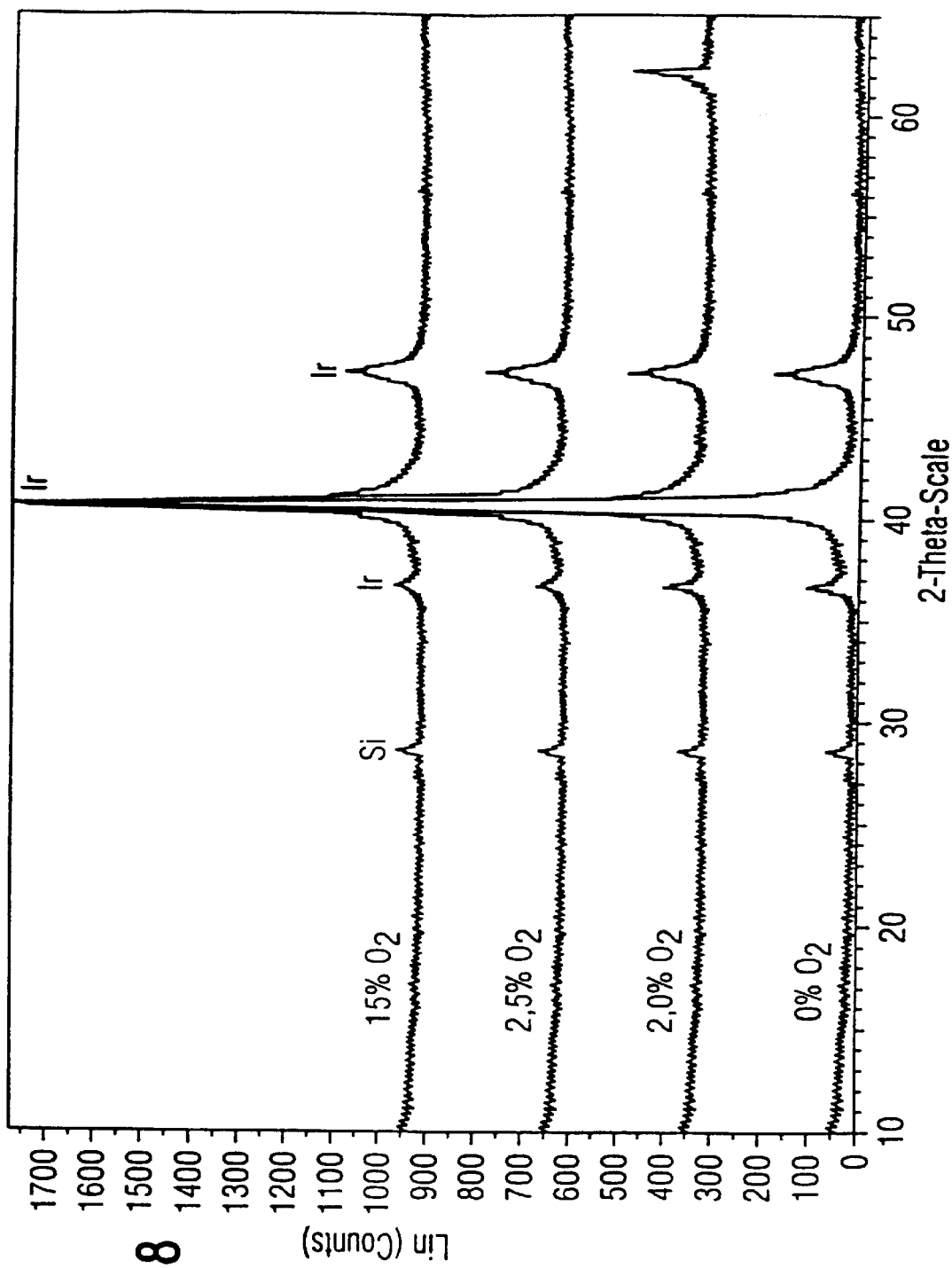
FIGS. 8 and 9 show results of X-ray structure investigations on deposited oxygen-containing iridium layers.
Figure 9:
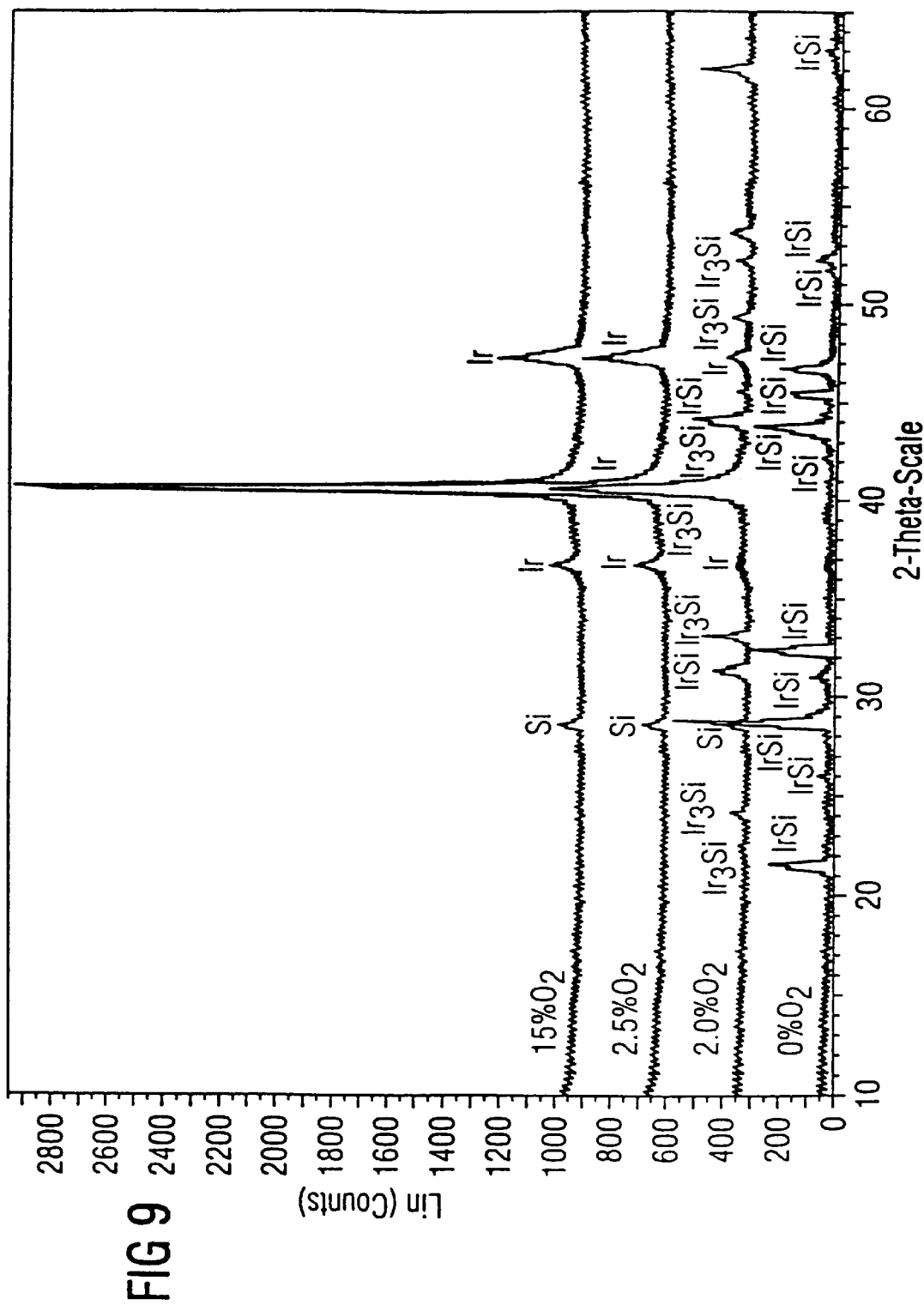

In FIGS. 8 and 9 the results are presented of X-ray structural analyses of oxygen-containing iridium layers deposited on polysilicon. FIG. 8 shows results obtained immediately after deposition of the oxygen-containing iridium layer while the results obtained after tempering at 700° C. in an atmosphere of nitrogen are entered in FIG. 9. Comparison of FIG. 8 with FIG. 9 clearly reveals that no silicide formation occurs during the high-temperature treatment of oxygen-containing iridium layers deposited in the presence of an oxygen concentration of at least 2.5%.

The oxygen-containing iridium layer is also characterizable through its relatively low oxygen content. The stoichiometric ratios of the oxygen-containing iridium layer deviate considerably from those of an iridium oxide layer (IrO2). This is revealed, for example, through the fact the oxygen-containing iridium layer contains more iridium than oxygen.

A further possibility for characterizing the oxygen-containing iridium layer consists of the fact that even at temperatures of up to 800° C. this layer on a conductive silicon-containing layer does not form a continuous iridium silicide layer, which would lead to an increase in the electrical resistance. The oxygen-containing iridium layer is therefore especially suitable for use as a barrier layer in a semiconductor memory that uses ferroelectric SBT or PZT as the capacitor dielectric.

Figure 6:
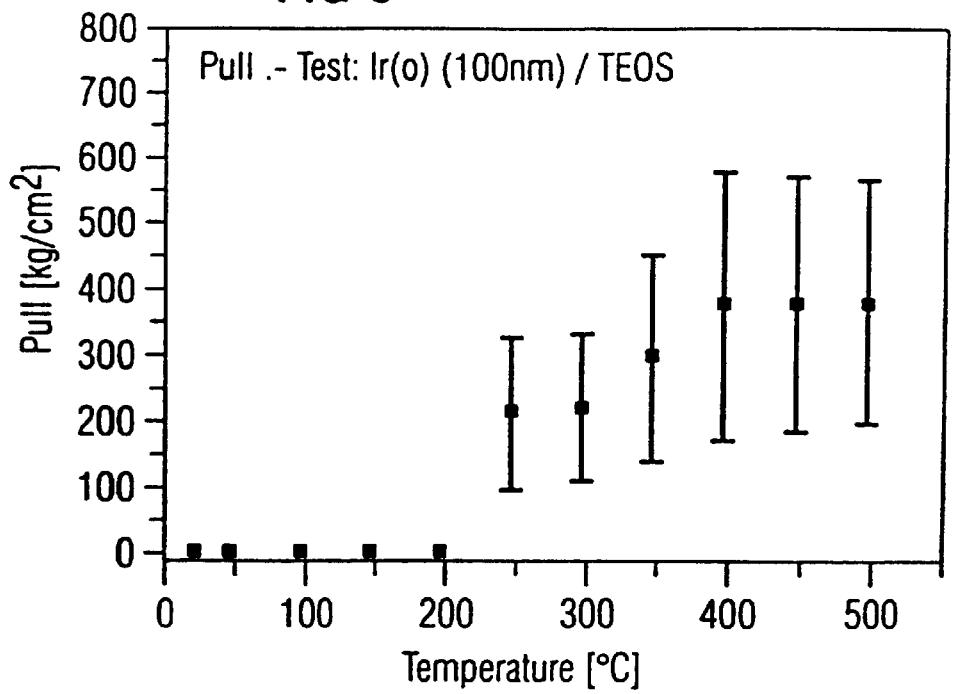
FIG. 6 shows the adhesive strength of an oxygen-containing iridium layer on a silicon oxide layer in dependence on the deposition temperature.
Figure 7:
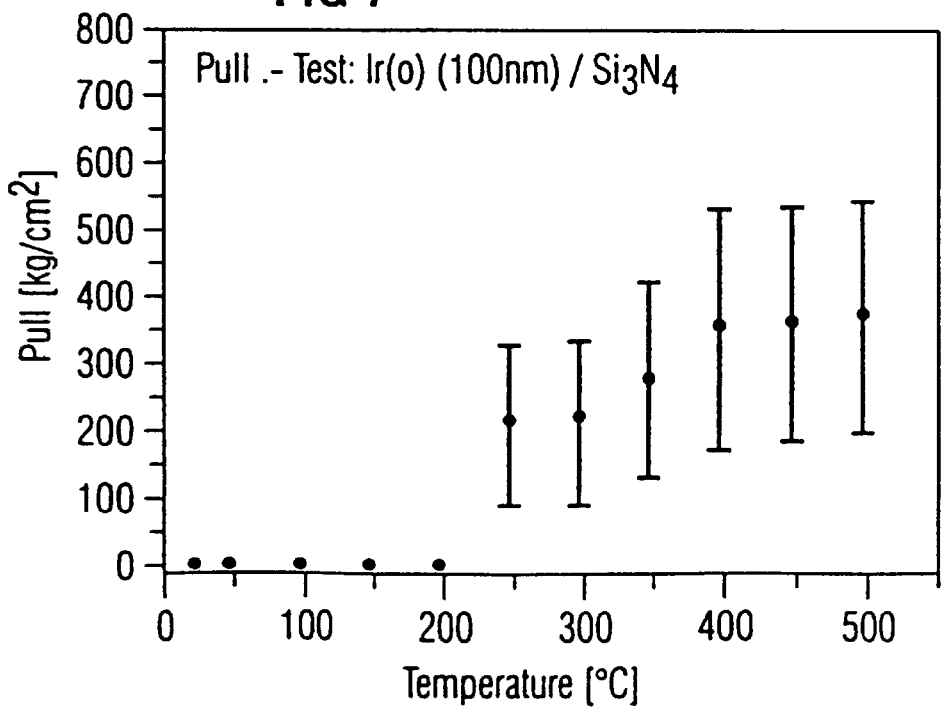
FIG. 7 shows the adhesive strength of an oxygen-containing iridium layer on a silicon nitride layer in dependence on the deposition temperature.

The adhesive strength of the anoxidized iridium layer (Ir(O)) in dependence on the deposition temperature is illustrated in FIGS. 6 and 7. FIG. 6 shows the adhesive strength of Ir(O) to a silicon oxide layer derived from TEOS deposition and FIG. 7 shows the adhesive strength to a stoichiometric silicon nitride layer ($Si_3N_4$). For both underlying layers the adhesive strength increases suddenly at approximately 250° C. and then increases with increasing deposition temperature. It is therefore advantageous to select a sufficiently high deposition temperature.

The adhesive strength can be determined in particular with a "pull test", which is also frequently referred to in the literature as a pull-off test, end pull test or Sebastian five test. The pull test enables quantitative statements to be made about the adhesive strength of thin layers on substrates. This test method normally involves a cylindrical body (stud) with one of its end faces fixed to the layer on the substrate by means of a connecting layer with very good adhesive properties. The connecting layer should combine the layer sufficiently firmly with the cylindrical body. A measuring instrument is then used to determine the force required to detach the cylindrical body from the substrate. Since the detachment can occur not only between the layer and the substrate but also between the cylindrical body and the layer being tested, or within the substrate or the layer, an appropriate follow-up test must be carried out to confirm that the detachment has occurred as intended. In determining the adhesive strength, the combining layer for fixing the cylindrical body to the layer (in the above case an oxygen-containing iridium layer) should have a sufficiently high adhesive strength, which is greater than the expected adhesive strength between the oxygen-containing iridium layer and the substrate.

We claim:

1. A microelectronic structure, comprising:
   a base substrate;
   a silicon-containing layer;
   an oxygen-barrier layer; and
   an oxygen-containing iridium layer located between said silicon-containing layer and said oxygen-barrier layer;
   said oxygen-containing iridium layer being a sputtered layer that is fabricated by sputtering in an atmosphere containing oxygen at a temperature of at least 250° C. with a volume percent of oxygen in the atmosphere being between 2.5% and 15%.

2. The microelectronic structure according to claim 1, wherein the volume percent of oxygen in the atmosphere is approximately 5%.

3. The microelectronic structure according to claim 1, wherein said oxygen barrier layer is a conductive metal oxide.

4. The microelectronic structure according to claim 3, wherein said conductive metal oxide is selected from the group consisting of iridium dioxide and ruthenium dioxide.

5. The microelectronic structure according to claim 1, wherein said silicon-containing layer is a material selected from the group consisting of polysilicon and at least one metal silicide.

6. The microelectronic structure according to claim 1, wherein:
   said silicon-containing layer includes a polysilicon layer and at least one metal silicide layer; and
   said metal silicide layer being located between said polysilicon layer and said oxygen-containing iridium layer.

7. The microelectronic structure according to claim 6, wherein said metal silicide layer includes at least one silicide selected from the group consisting of yttrium silicide, titanium silicide, zirconium silicide, hafnium silicide, vanadium silicide, niobium silicide, tantalum silicide, chromium silicide, molybdenum silicide, tungsten silicide, iron silicide, cobalt silicide, nickel silicide, palladium silicide, platinum silicide, and copper silicide.

8. The microelectronic structure according to claim 1, wherein:
   said silicon-containing layer includes at least one metal silicide; and
   said metal silicide is selected from the group consisting of yttrium silicide, titanium silicide, zirconium silicide, hafnium silicide, vanadium silicide, niobium silicide, tantalum silicide, chromium silicide, molybdenum silicide, tungsten silicide, iron silicide, cobalt silicide, nickel silicide, palladium silicide, platinum silicide, and copper silicide.

9. The microelectronic structure according to claim 1, wherein said silicon-containing layer is buried in said base substrate and is completely covered by said oxygen-containing iridium layer.

10. The microelectronic structure according to claim 1, wherein said silicon-containing layer and said oxygen-containing iridium layer are buried together in said base substrate and are completely covered by said oxygen-barrier layer.

11. The microelectronic structure according to claim 1, wherein said oxygen-containing iridium layer has a thickness of approximately 10 to 100 nm.

12. The microelectronic structure according to claim 1, wherein said oxygen-containing iridium layer has a thickness of approximately 20 nm to 50 nm.

13. The microelectronic structure according to claim 1, comprising a metal-containing electrode layer that covers said oxygen-barrier layer.

14. The microelectronic structure according to claim 13, comprising a metal-oxide-containing layer covering said metal-containing electrode layer.

15. The microelectronic structure according to claim 1, wherein said oxygen-containing iridium layer includes more iridium than oxygen.

16. A microelectronic structure, comprising:

a base substrate;

a silicon-containing layer;

an oxygen-barrier layer;

an oxygen-containing iridium layer located between said silicon-containing layer and said oxygen-barrier layer, said oxygen-containing iridium layer being a sputtered layer that is fabricated by sputtering in an atmosphere containing oxygen at a temperature of at least 250° C. with a volume percent of oxygen in the oxygen-containing atmosphere being between 2.5% and 15%;

an $IrO_2$ layer completely covering said oxygen-containing iridium layer; and a platinum layer located on said $IrO_2$ layer.

* * * * *